United States Patent [19]

Shin

[11] Patent Number: 5,036,529
[45] Date of Patent: Jul. 30, 1991

[54] DIGITAL AUTO-PHASE-CONTROLLED RETIMING CIRCUIT

[75] Inventor: Dong K. Shin, Seoul, Rep. of Korea

[73] Assignees: Electronics and Telecommunications Research Institute; Korea Telecommunication Authority, both of Rep. of Korea

[21] Appl. No.: 514,860

[22] Filed: Apr. 20, 1990

[30] Foreign Application Priority Data

Jun. 13, 1989 [KR] Rep. of Korea ................. 1989-8113

[51] Int. Cl.⁵ .......................................... H03L 7/081
[52] U.S. Cl. ................................. 375/119; 331/1 A
[58] Field of Search ........................... 331/1 A, 8, 25; 328/133; 375/106, 119, 120

[56] References Cited

U.S. PATENT DOCUMENTS

| | | | |
|---|---|---|---|
| 3,921,095 | 11/1975 | Chu | 331/1 A |
| 4,117,419 | 9/1978 | Rudd | 331/1 A |
| 4,675,617 | 6/1987 | Martin | 331/1 A |

Primary Examiner—Benedict V. Safourek
Attorney, Agent, or Firm—Ladas & Parry

[57] ABSTRACT

This invention provides a digital auto-phase-controlled retiming circuit which automatically locates the retiming clock phase in the center of input data eye pattern by detesting the phase difference between retiming clock and data and tracking adoptively the mutual phase variation in a case that the mutual phase difference between data and retiming clock is uncertain and changes according to time in digital transmission and-/or digital signal processing systems.

4 Claims, 4 Drawing Sheets

DIGITAL AUTO-PHASE-CONTROLLED RETIMING CIRCUIT

BACKGROUND OF THE INVENTION

The present invention relates to a digital auto-phase-controlled retiming circuit for preventing retiming error as a retiming clock is automatically retiming input data in the center position of input data eye pattern.

To process data inputed from outside in all communication and/or digital processing systems, the retiming process with a reference clock without retiming error must be preceded above all.

At this time, the reference clock can be extracted from external input data or provided in the system itself and the phase relation between a retiming clock and input data is not invariable due to various factors such as circuit implementation, temperature and aging variations, etc.

As the digital auto-phase-controlled retiming circuit can be used in all communication and/or digital processing systems, the objective range of conventional technology which can be considered is very wide, but it is able to discuss on two following aspects.

First, it is the case of retiming input data with a clock extracted from input data in a digital data transmission repeater.

The received data are usually contaminated by signal attenuation through transmission channels, noise generated in transmission channels or receivers, and inter-symbol interference due to insufficient transmission bandwidth, etc., thus clean waveforms must be recovered by retiming those data with the extracted clock.

For recovering a clock from input data, commonly used are a tuning circuit, a SAW filter and a PLL clock recovery circuit which are classified into self-timed clock extraction circuits.

In the tuning circuit or the SAW filter, the mutual phase difference between the extracted clock and the input data is greatly varied due to practical circuit implementation, temperature variation and the filter aging, etc., and accordingly, the phase of the retiming clock must be adjusted to the center of input data eye pattern using of a delay device which delays the input signal by a fixed amount. However, since it is so cumbersome that the mutual phase difference in every individual retiming circuit should be measured and adjusted. Moreover, the signal delay time is fixed, so that the retiming clock phase may be irrelevant against temperature, aging and supplied power level variation.

A circuit which is retiming by detecting the phase difference between the recovered clock and input data (here, input data phase means data transition moment with respect to clock phase and clock phase means the significant instant) and then shifting automatically the clock phase to the center of input data eye pattern, is utilize.

Those examples are as follows; 'Automatic Timing Alignment for Regenerative Repeater published in Electronics Letters, Vol. 21, No. 24', 'An Unedersea Fiber-Optic Regenerator Using an Integrated Substrate Package and Flip-Chip SAW Mounting published in IEEE Jr. SAC, Vol. 2, No. 6', 'Novel Regenerator Having Simple Clock Extraction and Automatic Phase-Controlled Retiming Circuit published in Electronics Letters, Vol. 25, No. 1'.

However, a Gilbert cell or varacter diode, etc. being used at this time, which are component of an analog phase shifter, has a disadvantage for supplied power level changes.

Also, it is not easy to handle the phase shift control signals. In addition they are bulky in low frequency operation.

A timing recovery circuit, which utilizes a PLL clock recovery circuit, can be designed so that the significant instant of clock is retiming automatically in the center of input data eye pattern. One example is 'Self-Correcting Clock Recovery Circuit with Improved Jitter Performance published in Electronics Letters, Vol. 23, No. 2'. But since utilizing an analog loop filter and voltage-controlled-oscillator this circuit has defects that are bigger in size and more complicated than the case of utilizing a SAW filter, etc.

Second, SONET (synchronous optical network), switching and subscriber systems are made up of many signal processing units and require data transmission between each unit.

At this time, because the reference clock is provided from the center clock supply station, it is not necessary to extract clocks from input data in each of signal processing units but to do retiming with provided clocks in the center of input data eye pattern.

As clocks and input data are transmitted to each unit through independent paths, it is difficult to know exactly their mutual phase relation between clock and data in each processing unit.

In a case of retiming by shifting the clock phase with the use of devices having fixed signal delay, there are defects which not only adjust and measure the phase difference between data and clocks against each of signal processing units, but also can be retiming in inappropriate position against temperature, supplied power level changes and aging variation.

As another example, there are also above problems in a case of applying data and clock into BER (bit error ratio) measuring equipments used always to test the performance of communication systems.

A conventional digital retiming circuit published in 'Switching of 140 Mb/s Signal in Broadband Communication System in Electrical Communication Vol. 58, No. 4' has defects that it cannot be retiming in the center of input data eye pattern, and also a digital retiming circuit which consists of DPLL (digital PLL) has restriction in operation speed because an oscillator of higher frequency is necessary.

SUMMARY OF THE INVENTION

Accordingly an object of the invention is to provide a digital auto-phase-controlled retiming circuit which automatically locates the retiming clock phase in the center of input data eye pattern wherein the effect of intersymbol interference is minimum and the tolerance of noise is maximum, by detecting the phase difference between retiming clock and data and tracking adaptively the mutual phase variation in a case that the mutual phase difference between data and retiming clock is uncertain and changes according to time in digital transmission and/or digital signal processing systems.

BRIEF DESCRIPTION OF THE INVENTION

The invention will be readily understood from the following more detailed description presented in conjunction with the followingt drawings, in which FIG. 1 is a construction diagram showing a digital auto-phase-controlled retiming circuit.

DETAILED DESCRIPTION OF THE PREFERRED EMBODIMENT

Figure 1:
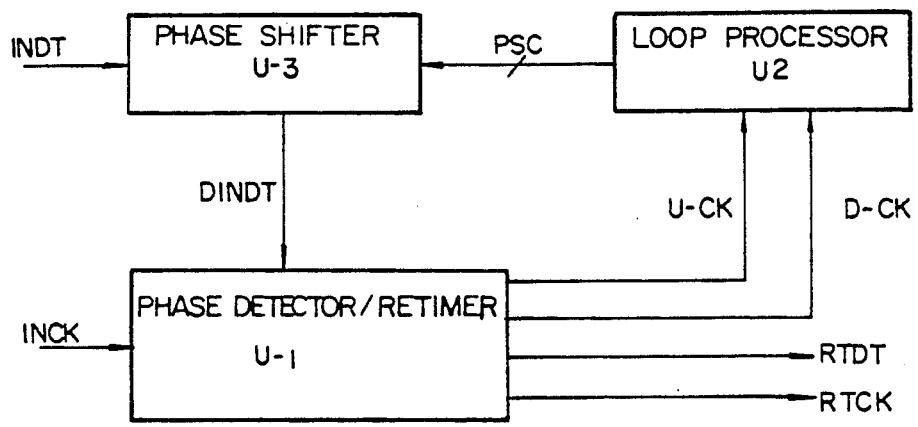

A digital auto-phase-controlled retiming circuit of the invention is a negative feedback digital circuit which consists of a phase detector/retimer (U1), a loop process or (U2) and a phase shifter (U3), as shown in FIG. 1.

A phase detector/retimer (U1) detects the phase difference between the input clock (INCK) and the delayed input data (DINDT), and applies into a loop processor (U2) the state signals showing the phase of data leads or lags against the significant instant of clock (that is, the rising edge of retiming clock).

At this time, the clock-typed state signals are applied into a loop processor (U2), and the pulse-widths of this state signals are not smaller than those of retiming clocks so that the circuit can be operated to the maximum usable speed.

Also, a phase detector/retimer (U1) does retime the delayed input data (DINDT) whose phase is adaptively controlled by a phased shifter (U3).

A loop processor (U2) generates and produces into a phase shifter (U3) the control bus signal (PSC), making use of phase state signals (U-CK, D-CK) applied from a phase detector/retimer (U1), According to this control bus signal a phase shifter (U3) controls the phase of input data (INDT) and produces delayed input data (DINDT) into a phase detector/retimer (U1).

Figure 2:
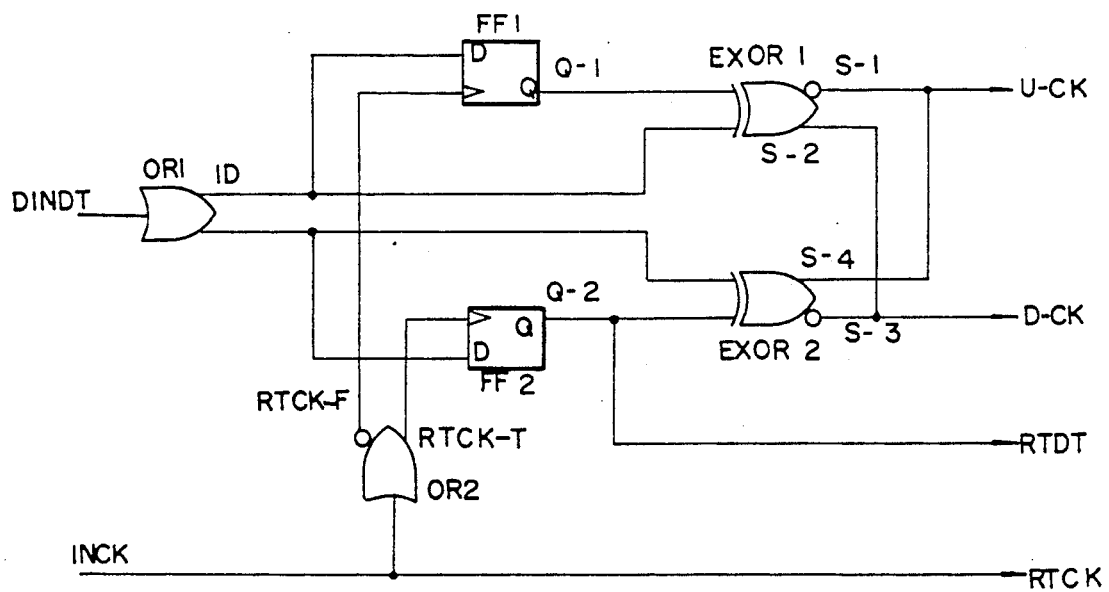
FIG. 2 is a sample diagram showing a phase detector/retimer.

FIG. 2 is a sample for explaining a phase detector/retimer (U1) having a data (DINDT) and a clock input terminal (INCK), and state signal outputs (U-CK, D-CK), a retimed data output (RTDT) and a retiming clock output (RTCK).

As shown in FIG. 2 a data input terminal (DINDT) is connected to the input of a logic sum gate (OR1), and outputs (ID) of the said logic sum gate (OR1) are connected to data input terminals of D flip-flops, (FF1, FF2), and one input terminal of exclusive logic sum gates, (EXOR1) and (EXOR2) individually.

A data output (Q-1) of said D flip-flop (FF1) is connected to one remaining input of said exclusive logic sum gate (EXOR1), and a data output (Q-2) of said D flip-flop (FF2) is connected to one remianing input of said exclusive logic sum gate (EXOR2). Also, this signal becomes the retimed output data (RTDT).

A clock input singal (INCK) is applied to a logic sum gate (OR2) and simultaneously becomes a retiming clock output (RTCK).

A inverting output (RTCK-F) of said logic sum gate (OR2) is connected to a clock input terminal of said D flip-flop (FF1), and also a remaining noninverting output (RTCK-T) of said logic sum gate (OR2) to a clock input terminal of said D flop-flop (FF2).

A positive output (S-2) of said exclusive logic sum gate (EXOR1) is wired ORed with a negative output (S-3) of said exclusive logic sum gate (EXOR2), and becomes a down state signal output (D-CK). If wired ORing is not available, and logic sum gate can be used instead of wired ORing.

Also, a negative output (S-1) of said exclusive logic sum gate (EXOR1) is wired ORed with a positive output (S-4) of said exclusive logic sum gate (EXOR2), and becomes a up state signal output (U-CK). If wired ORing is not available, a logic sum gate can be used instead of wired ORing.

A said down state and up state signal output (D-CK, U-CK) become input signals of a loop processor (U2).

As the thing constructed like the above devices, first in a case that the phase of input data is located between the rising edge of a retiming clock (RTCK-T), and that of a inverted retiming clock (RTCK-F), explaining for the operation in conjunction with waveforms described in FIG. 3 will be as follows.

Figure 3:
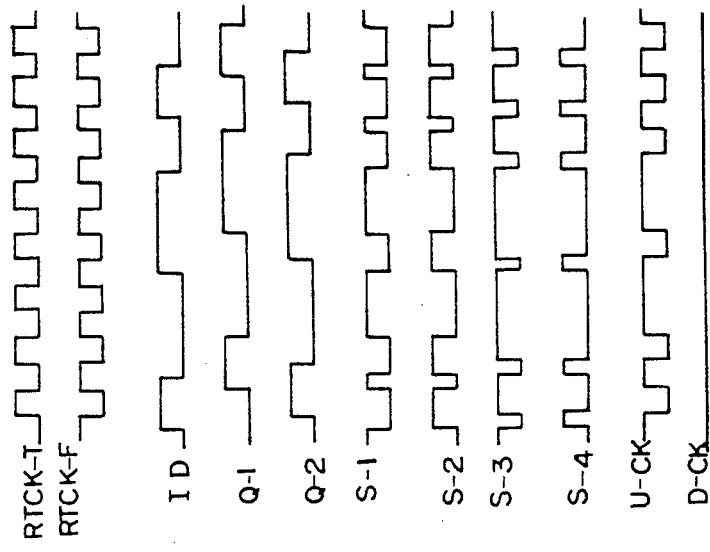
FIG. 3 is a diagram showing timing waveforms in each part of FIG. 2 when the phase of input data is located between the rising transition edge of a retiming clock and that of a inverted retiming clock.

Every time when data transitions take place in input data (ID), a signal (S-2), which an output signal (Q-1) of D flip-flop (FF1) being operated by a inverted retiming clock (RTCK-F) and input data (ID) are exclusive ORed, becomes 1 during the time between the transition edge of input data and the rising edge of a inverted retiming clock (RTCK-F), but 0 in remaining time as shown in FIG. 3.

A signal (S-1) is opposed to that.

Also, every time when data transitions take place in input data (ID), a signal (S-4), which an output signal (Q-2) of D flip-flop (FF2) being operated by a retiming clock (RTCK-T) and input data (ID) are exclusive ORed, becomes 1 during the time between the transition edge of input data and the rising that of a retiming clock (RTCK-T), but 0 in remaining time.

A signal (S-3) is opposed to that.

Therefore, (U-CK) which (S-1) and (S-4) are ORed becomes always 1, but (D-CK) which (S-2) and (S-3) are ORed becomes 0 during the half cycle every time when data transitions of data (ID) take place, then it is possible to know the phase state of input data against the significant instant of retiming clocks (RTCK-T).

A case that the phase of input data is located between the rising edge of a inverted retiming clock (RTCK-F) and that of a retiming clock (RTCK-T) is also operated by the same principle, and in this case only the up state signal (U-CK) is activated.

Figure 4:
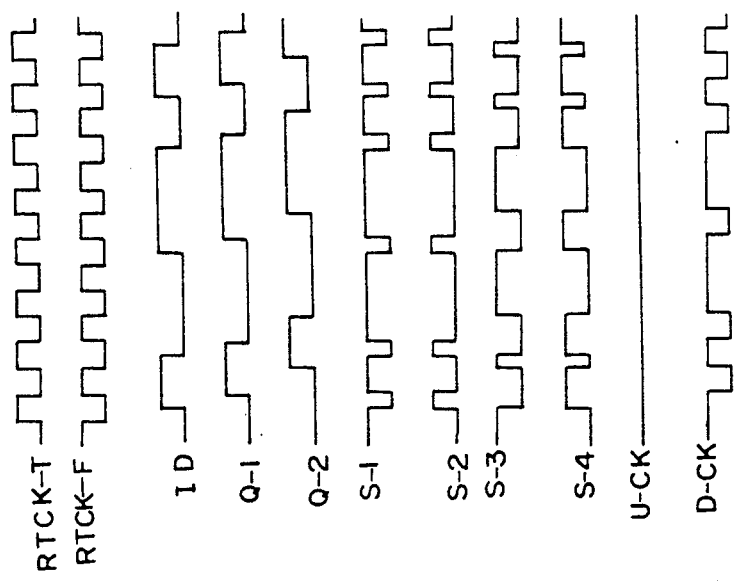
FIG. 4 is a diagram showing timing waveforms in each part of FIG. 2 when the phase of input data is located between the rising transition edge of a inverted retiming clock and that of a retiming clock.

The waveform diagrams at that time are shown in FIG. 4.

In steady state the significant instant of a retiming clock (RTCK-T) will be located in the center of input data eye pattern, and produce correct retimed data.

Figure 5:
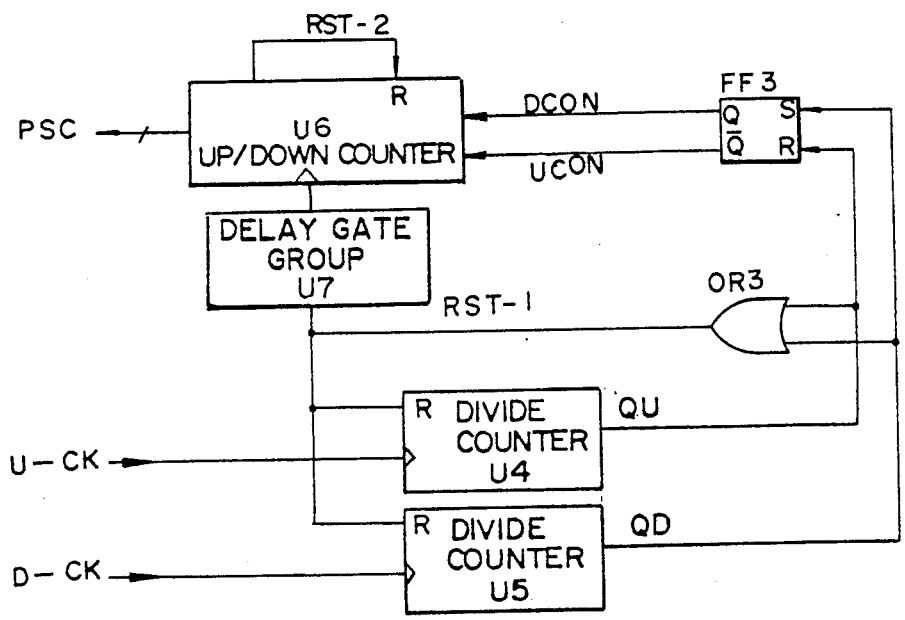
FIG. 5 is a sample diagram showing a loop processor.

A loop processor (U2) does a function for removing the possibility of wrong operation due to the undesired signals such as noise and intersymbol interference related to input data, etc., and its example is described in FIG. 5.

The inputs such as a up and down state signal, (U-CK, D-CK), are connected to clock inputs of N divide counters, (U4) and (U5), individually.

An output (QU) of said divide counter (U4) is connected to one input of a logic sum gate (OR3) and the reset input of a SR flip-flop (FF3).

Also, an output (QD) of said divide counter (U5) is connected to one remaining input of a logic sum gate (OR3) and the set input of said SR flip-flop (FF3).

An output (RST-1) of said logic sum gate (OR3) is connected to the reset inputs of said N divided counters (U4, U5) and a delay gate group (U7).

An output signal of said delay gate group (U7) is connected to the clock input terminal of an up/down counter (U6).

Also, the outputs (DCON), (UCON) of said SR flip-flop (FF3) are connected to direction control input terminals of an up/down counter (U6).

An output bus signal (PSC) of said up/down counter (U6) becomes control outputs to a phase shifter (U3).

As the thing having above construction, first, explaining for the case that only the up state signal (U-CK) is activated will be as follows, In initial state a N divide counter (U5) holds continuously the reset state, that is, 0 value, but a N divide counter (U4) counts the clock number of the up state signal (U-CK), and as the output (QU) becomes 1 at a moment when the value of the clock number exceeds N, it resets individual N divided counters, (U4, U5).

As the output (QU) returns 0 after propagation delay time of N divide counter and logic sum gate (OR3), it produces clock pulses for operating an up/down counter (U6).

Where a delay gate group (U7) plays a role for applying clock pulse after enough time so that outputs (DCON, UCON) of the SR flip-flop give effect to the U/D counter before clock pulse arrival.

In an opposite case it is also possible to be explained by the same principles.

A reset signal (RST-2) of an up/down counter (U6) which can count from 0 to 2M prevents data loss due to a sudden counting value change from 0 to 2M, or vise versa, makes the up/down counter (U6) start from M when it monitors 0 or 2M control values.

Figure 6:
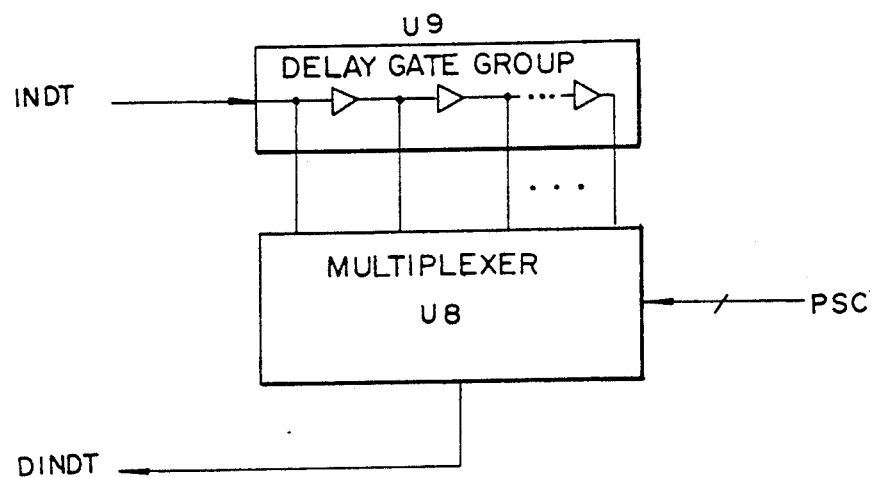
FIG. 6 is a sample diagram showing a phase shifter.

A phase shifter (U3) can be implemented in a several way, but its one example is described in FIG. 6.

It consists of a 2M delay gate group (U9) with each having unit phase delay, and a 2M:1 multiplexer (U8).

The unit phase delay value, D, and up/down counter half address, M, should satisfy $D*M \geq T$. Here T is the time period. (i.e. inverse of operating frequency.)

A digital auto-phase-controlled retiming circuit of the invention has the characteristics that the significant instant of retiming clock is located in the center of input data eye pattern.

When it starts operation in a case that the significant instant of the retiming clock is located in the data transition, it happens to escape from it and goes to the steady state.

So to speak, the significant instant of inverted retiming clock will be located in the data transition edge.

As expressed more exactly, the significant instant of inverted retiming clock with respect to the data transition edge is located within the set up time and the hold time of D flip-flop used as the retiming device.

In a case of constructing a retiming circuit for 155 Mb/s data processing making use of a ECL logic device, the sum of set up time and hold time are about 0.5 nsec. Assuming that a gate whose unit propagation delay time is 1 nsec is utilized as a component of a gate delay group (U9), the significant instant of retiming clock fluctuates with deviation of about 0.5 nsec before and behind to the center of eye pattern of data.

Thus the significant instant of the retiming clock is located in the center of the data eye pattern with 0.5 nsec deviation.

Figure 7:
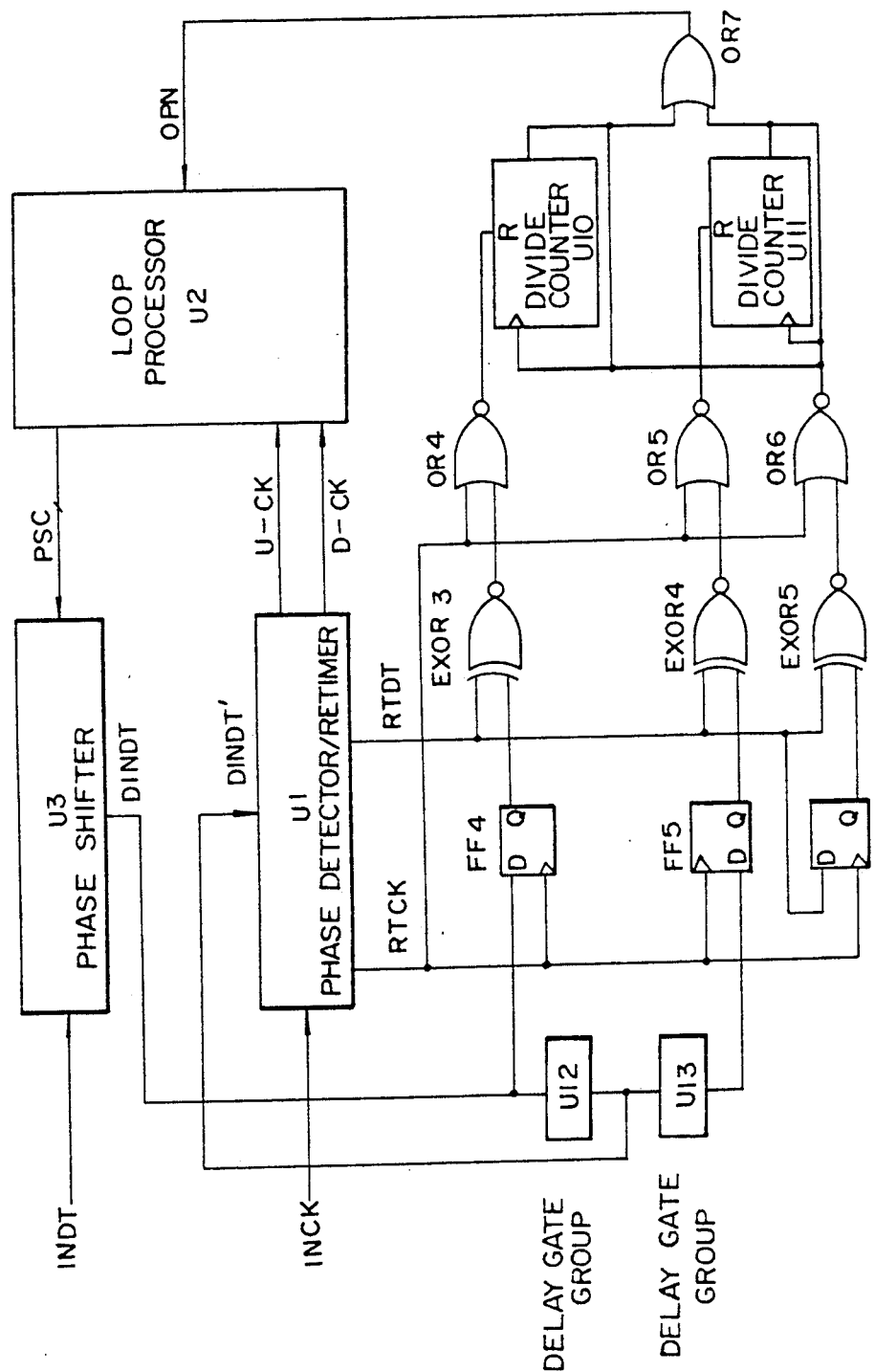
FIG. 7 is a construction diagram showing a stabilized digital auto-phase-controlled retiming circuit.

The construction for removing this fluctuation and making it stay on the fixed center position in steady state is described in FIG. 7.

The output of a phase shifter (U3) is applied into a phase detector/retimer (U1) after passing through a delay gate group (U12), and the retimed output data from phase detector/retimer (U1) is compared with two outputs of two D flip-flops (FF4, FF5) one of which is retiming the phase shifter (U3) output directly, the other of which is retiming the output of a delay gate group (U13) having the same signal delay as that of a delay gate group (U12). Retimed data (RTDT) and output of D Flip-flop (FF6) are ORed exclusively such that it becomes 0, only when data transitions take place.

If the same values continue above K times at each outputs of exclusive logic sum gates (EXOR3, EXOR4), the output of a K divide counters, (U10) and (U11) become 1, and these signals are applied into the input of a logic sum gate (OR3) in a loop processor (U2), this results remove the fluctuation of phase shift control bus signal (PSC). Also these output signals of K divide counters, (U10, U11) disable the counters to count any more until the reset input is applied.

Other example construction of the invention illustrated in FIG. 7 comprised wherein a stabilized circuit consists of delay circuits (U12), (U13), D flip-flops (FF4), (FF5), (FF6), exclusive logic sum gates (EXOR3), (EXOR4), (EXOR5), logic sum gates (OR4), (OR5), (OR6), K divide counters (U10), (U11), and a logic sum gate (OR7) other than a phase detector/retimer (U1), a phase shifter (U3), and a loop processor (U2) described above.

The present invention constructed as above has following acting effects.

1. The problems which static value of the phase difference between clocks and data is uncertain when designing a retiming circuit have been completely solved.
2. As retiming always in the center of input data eye pattern against dynamic fluctuation of input data phase due to the temperature and aging changes or the external factors, there are not retiming errors.
3. Because circuit operation speed depends on only set up time and hold time of D flip-flop, a retiming device, it is possible to be used as a high speed retiming circuit.
4. Because circuit construction consists of only digital devices, it is possible to be manufactured with small customized semiconductors.
5. The reproduction and reliability related to the mass production is excellent.
6. As having very large jitter tolerance in a case of being used in series to a timing recovery circuit (that is, when used in a repeater), it is capable of maximizing maintenance section.
7. When combined with conventional timing extraction circuit, the input jitter tolerance and jitter transfer function can be controlled independently.

What is claimed is:

1. A digital auto-phase-controlled retiming circuit, comprising:
    a first logic sum gate (OR1) for receiving input data signals (DINDT) having controlled phase and for producing a first and a second data signal;

a second logic sum gate (OR2) for receiving a input clock and for producing a first clock and a inverted second clock;

a first D flip-flop (FF1) for producing retimed data signal according to said inverted second clock and having a data input terminal for receiving said first data signal from said first logic sum gate (OR1) and a clock terminal for receiving said inverted second clock from said second logic sum gate (OR2);

a second D flip-flop (FF2) for producing retimed data signal according to said first clock and having a data input terminal for receiving a second data signal from said first logic sum gate (OR1) and a clock terminal for receiving said first clock from said second logic sum gate (OR2);

a first exclusive logic sum gate (EXOR1) for producing a first output (S-2) and a inverted second output (S-1) by ORing exclusively said retimed data signal of said first D flip-flop (FF1) and said first data signal of said first logic sum gate (OR1);

a second exclusive logic sum gate (EXOR2) for producing a third output (S-4) and inverted fourth output (S-3) by ORing exclusively said retimed data signal of said second D flip-flop (FF2) and said second data signal of said first logic sum gate (OR1);

a first logic sum means for producing a first phase state signal (U-CK) by electrically connecting said second output of said first exclusive logic sum gate (EXOR1) and said third output of said second exclusive logic sum gate (EXOR2) together;

a second logic sum means for producing a second phase state signal (D-CK) by electrically connecting said first output of said first exclusive logic sum gate (EXOR1) and said fourth output of said second exclusive logic sum gate (EXOR2) together;

a loop processor (U2) generating and then providing a control bus signal (PSC), so that the phase difference between said phase controlled input data (DINDT) and an input clock (INCK) has proper phase relation making use of output signals (U-CK, D-CK) of said first and second logic sum means; and a phase shifter (U3) controlling the phase of said input data according to said control signal from said loop processor (U2) and then providing the phase controlled input data (DINDT) into said first logic sum gate (OR1), wherein said input clock (INCK) is a retiming clock (RTCK) and the output of said second D flip-flop (FF2) is a retimed data signal (RTDT).

2. A digital auto-phase-controlled retiming circuit according to claim 1, wherein said loop processor (U2) comprises a first and a second N divide counter (U4, U5) with each N divide counter having a clock input terminal, a SR flip-flop (FF3), an up/down counter (U6), A gate delay circuit (U7), and a third logic sum gate (OR3), and a first and a second state signal (U-CK, D-CK) is applied to each said clock input terminal, respectively, of said first and said second N divide counter (U4, U5), and an output signal (QU) of said N divide counter (U4) is applied to a first input terminal of said logic sum gate (OR3) and a reset input signal of a SR flip-flop (FF3), and an output signal (QD) of said N divide counter (U5) is applied to a second input terminal of said logic sum gate (OR3) and a set input signal of SR flip-flop (FF3), and an output signal (RST-1) of said third logic sum gate (OR3) is applied to reset inputs of said N divide counters (U4, U5) and said delay gate circuit (U7), and an output signal of said delay gate circuit (U7) is applied to a clock terminal of said up/down coutner (U6), and output signals (DCON, UCON) of said SR flip-flop (FF3) are applied to direction control input terminals of said up/down counter (U6), and said up/down counter (U6) provides a control bus signal (PSC) to said phase shifter (U3) and said up/down counter (U6) includes a reset terminal for resetting the count of said up/down counter (U6) to M when said up/down counter's count is 0 to 2M.

3. A digital auto-phase controlled retiming circuit according to claim 1 further comprising a first gate delay circuit (U12) connected between said output terminal of said shifter (U3) and said input terminal of said first logic sum gate (OR1).

4. A digital auto-phase controlled retiming circuit according to claim 3 further including a stabilizing circuit which comprises:

a second gate delay circuit (U13) connected to said first gate delay circuit (U12);

a third, fourth and fifth D flip-flop (FF4, FF5, FF6) with each said D flip-flop having a D terminal for receiving an output (DINDT) of said phase shifter (U3), an output of said gate delay circuit (U13) and a retiming data signal (RTDT), respectively;

said third, fourth and fufth D flip-flop (FF4, FF5, FF6) with each having a clock terminal for receiving a retiming clock signal (RTCK);

a third, fourth and fifth exclusive logic sum gate (EXOR3), EXOR4, EXOR5) with each exclusive logic sum gate having a first and a second input terminal with each said first input terminal for receiving the output of said D flip-flops (FF4, FF5, FF6), respectively, and each said second input terminal for receiving a retiming data signal (RTDT);

a fourth, fifth and sixth logic sum gate (OR4, OR5, OR6) with each logic sum gate having a first and a second input terminal with said first input terminal for receiving said retiming clock (RTCK), respectively, and with said second input terminal for receiving reverse outputs of said exclusive logic sum (EXOR3, EXOR4, EXOR5), respectively;

a first and second K divide counter (U10, U11) with each said counter having a reset terminal (R) for receiving reverse outputs of logic sum gates (OR4, OR5), respectively, and each said counter having a clock input terminal for receiving a reverse output of said logic sum gate (OR6) and each said counter having an output terminal and with each output terminal connected to said respective clock input terminals of said first and said second K divide counter; and a logic sum gate (OR7) connected to said output terminal of each said first and said second K divide counter (U10), (U11), wherein an output of said logic sum gate (OR7) is applied to an input terminal of said logic sum gate (OR3) of loop processor (U2).

* * * * *